United States Patent [19]

Tanizawa et al.

[11] Patent Number: 5,556,805
[45] Date of Patent: Sep. 17, 1996

[54] METHOD FOR PRODUCING SEMICONDUCTOR DEVICE HAVING VIA HOLE

[75] Inventors: Tetsu Tanizawa; Hideo Takuda, both of Kawasaki, Japan

[73] Assignee: Fujitsu Limited, Kawasaki, Japan

[21] Appl. No.: 372,903

[22] Filed: Jan. 17, 1995

Related U.S. Application Data

[63] Continuation of Ser. No. 954,467, Sep. 30, 1992, abandoned, which is a continuation of Ser. No. 690,575, Apr. 24, 1991, abandoned.

[30] Foreign Application Priority Data

Apr. 27, 1990 [JP] Japan .................... 2-112923

[51] Int. Cl.⁶ .................................. H01L 21/283
[52] U.S. Cl. .......................... 437/195; 437/250
[58] Field of Search .................... 437/187, 195, 437/250; 364/491; 257/206, 210

[56] References Cited

U.S. PATENT DOCUMENTS

| | | | |
|---|---|---|---|
| 4,349,609 | 9/1982 | Takeda et al. | 437/195 |
| 4,523,372 | 6/1985 | Balda et al. | 437/195 |
| 4,605,470 | 8/1986 | Gwozdz et al. | 357/71 R |
| 4,949,162 | 8/1990 | Tamaki et al. | 357/71 |
| 4,994,735 | 2/1991 | Leedy | 324/158 F |
| 5,182,235 | 1/1993 | Eguchi | 437/238 |

FOREIGN PATENT DOCUMENTS

| | | | |
|---|---|---|---|
| 0061939 | 10/1982 | European Pat. Off. . | |
| 0206444 | 12/1986 | European Pat. Off. . | |
| 2927824 | 1/1980 | Germany | 437/195 |
| 59-127850 | 7/1984 | Japan | 437/195 |
| 0276345 | 12/1986 | Japan | 437/195 |
| 0293950 | 11/1988 | Japan | 437/195 |
| 1-77145 | 3/1989 | Japan . | |
| 1108748 | 4/1989 | Japan . | |
| 0108748 | 4/1989 | Japan | 437/195 |
| 1-196141 | 8/1989 | Japan | 437/195 |
| 117137 | 5/1990 | Japan . | |
| 90/03046 | 3/1990 | WIPO . | |

*Primary Examiner*—Mary Wilczewski
*Assistant Examiner*—Richard A. Booth
*Attorney, Agent, or Firm*—Staas & Halsey

[57] ABSTRACT

A semiconductor device includes a first layer, a first interconnection layer formed on the first layer, at least one dummy pad formed on the first layer in a vicinity of the first interconnection layer, a second layer which is made of an insulator material and is formed on the first layer so as to cover the first interconnection layer and the dummy pad, and a second interconnection layer formed on the second layer and electrically coupled to the first interconnection layer via a via hole in the second layer. The dummy pad is provided in a vicinity of the via hole so that the second layer is approximately flat at least in the vicinity of the via hole, and the dummy pad is electrically isolated from the first and second interconnection layers.

8 Claims, 12 Drawing Sheets

UPPER INTERCONNECTION

LOWER INTERCONNECTION

VIA HOLE

LOWER INTERCONNECTION

VIA HOLE PATTERN

——————————  UPPER INTERCONNECTION

| |  LOWER INTERCONNECTION

VIA HOLE

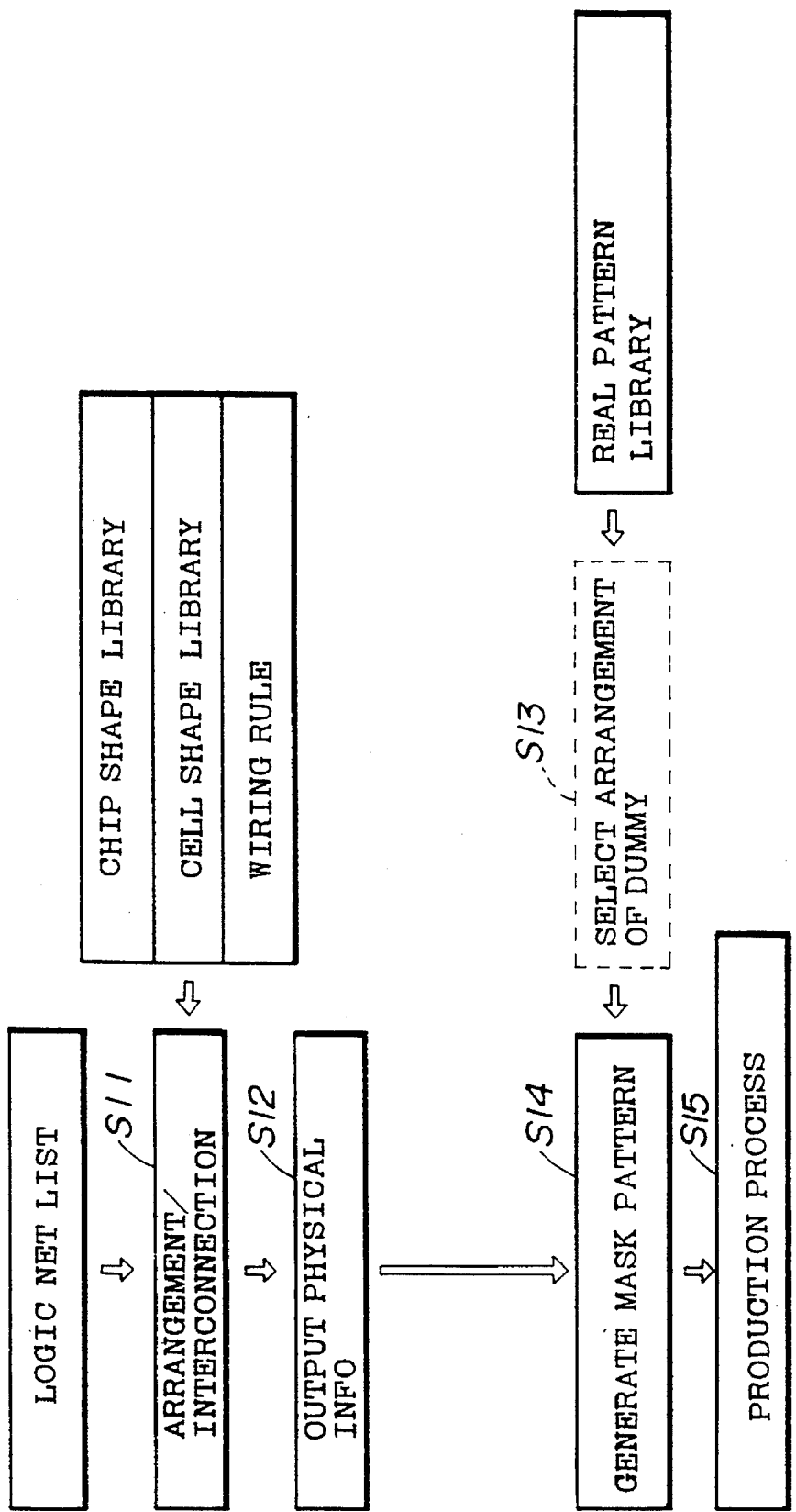

METHOD FOR PRODUCING SEMICONDUCTOR DEVICE HAVING VIA HOLE

This application is a continuation of application Ser No. 07/954,467, filed Sep. 30, 1992, now abandoned, which is a continuation of application Ser. No. 07/690,575, filed Apr. 24, 1991, now abandoned.

BACKGROUND OF THE INVENTION

The present invention generally relates to semiconductor devices and methods of producing semiconductor devices, and more particularly to a semiconductor device having a via hole for connecting multi-level interconnection and a method of producing such a semiconductor device.

FIG. 1A shows a plan view of a circuit pattern which is generated from component information of a via hole pattern by a computer aided design (CAD). FIG. 1B shows a cross sectional view of a semiconductor device which is produced based on the circuit pattern shown in FIG. 1A.

In FIG. 1A, a lattice grid pattern 1 is used as a basis for arranging circuit patterns on a screen of a CRT device. The position of each circuit pattern is determined by grids (intersections) 2 of the grid pattern 1. A via hole pattern 3 is used to connect an upper interconnection layer and a lower interconnection layer. Pad patterns 4 and 5 are respectively provided with respect to the upper and lower interconnection layers.

In order to guarantee a positive connection of the upper and lower interconnection layers via the via hole, the pad patterns 4 and 5 respectively are set larger than the region of the via hole pattern 3 by taking into account the alignment margin. In addition, when determining the pattern arrangement by the CAD, the pad patterns 4 and 5 are generated as component information of the via hole pattern 3 when the via hole pattern 3 is generated.

In FIG. 1B, a lower interconnection pad 7 made of Al is formed on a substrate 6. An upper interconnection pad 10 made of Al connects to the lower interconnection pad 7 via a via hole 9 which is formed in an interlayer insulator 8.

When the multi-level interconnection structure is formed using the conventional method of generating the circuit pattern, a stepped part is formed in an interlayer insulator 13 when a lower interconnection 12 is formed on a substrate 11 as shown in FIG. 2A. For this reason, an upper interconnection 15 which is made of Al may become thin at a part A or a dent B may be formed due to the stepped part.

Generally, when forming an Al layer on a stepped part, the Al flows to the lower part and the thickness of the Al layer at the stepped part becomes smaller than that at other parts. Particularly when a via hole exists near the stepped part, the thickness of the Al layer at the stepped part becomes extremely thin and a disconnection easily occurs. In addition, the dent in the Al layer at the via hole becomes deep, and it is extremely difficult to make a satisfactory 3-level or 4-level interconnection structure.

On the other hand, a lower interconnection 16 may be provided adjacent to the lower interconnection 12 as shown in FIG. 2B. In this case, a stepped part is formed in the interlayer insulator 13 in a vicinity of the via hole 14 on the side where no lower interconnection 16 is provided. As a result, when forming the via hole 14 by an exposure apparatus using a mask, the focal distance of the exposure apparatus becomes different depending on the location on the interlayer insulator 13, and it is impossible to accurately form the via hole 14. Consequently, the connection of the upper and lower interconnections 15 and 12 may become incomplete.

Furthermore, the upper interconnection 15 is sloped at a part C above the via hole 14. For this reason, it is difficult to use the part C as an interconnection pad when connecting the upper interconnection 15 to another upper interconnection (not shown) via a via hole (not shown), and a satisfactory multi-level interconnection having 3 or more levels is extremely difficult to realize.

FIG. 2C shows a case where an interconnection 17 is provided under the lower interconnection 12 via the interlayer insulator 13 and the interconnection 17 is adjacent to the lower interconnection 12 in the plan view. In this case, the lower interconnection 12 becomes sloped, and it is difficult to accurately form the via hole 14 above the sloped part of the lower interconnection 12. In addition, the upper interconnection 15 also becomes sloped above the via hole 14. Therefore, it is difficult to use the sloping part of the upper interconnection 15 as an interconnection pad when connecting the upper interconnection 15 to another upper interconnection (not shown) via a via hole (not shown), and a satisfactory multi-level interconnection having 3 or more levels is extremely difficult to realize.

SUMMARY OF THE INVENTION

Accordingly, it is a general object of the present invention to provide a novel and useful semiconductor device and a method of producing a semiconductor device, in which the problems described above are eliminated.

Another and more specific object of the present invention is to provide a semiconductor device comprising a first layer, a first interconnection layer formed on the first layer, at least one dummy pattern formed on the first layer in a vicinity of the first interconnection layer, a second layer which is made of an insulator material and is formed on the first layer so as to cover the first interconnection layer and the dummy pattern, where the second layer has a via hole, and a second interconnection layer formed on the second layer and electrically coupled to the first interconnection layer via the via hole. The dummy pattern is provided in a vicinity of the via hole so that the second layer is approximately flat at least in the vicinity of the via hole, and the dummy pattern is electrically isolated from the first and second interconnection layers. According to the semiconductor device of the present invention, it is possible to suppress the unevenness or step in the second layer in the vicinity of the via hole without being affected by the surrounding interconnections and the like. Hence, combined with the planarization technique of the conventional wafer process, it is possible to further planarize the surface of the second layer, and it is possible to realize a highly reliable multi-level interconnection structure.

Still another object of the present invention is to provide a method of producing a semiconductor device comprising the steps of forming a first interconnection layer and at least one dummy pattern on a first layer, forming a second layer which is made of an insulator material on the first layer so as to cover the first interconnection layer and the dummy pattern, forming a via hole in the second layer to expose a surface of the first interconnection layer, where the via hole is formed in a vicinity of the dummy pattern, and forming a second interconnection layer on the second layer to make electrical contact with the first interconnection layer via the via hole, where the dummy pattern is electrically isolated from the first and second interconnection layers.

Other objects and further features of the present invention will be apparent from the following detailed description when read in conjunction with the accompanying drawings.

BRIEF DESCRIPTION OF THE DRAWINGS

FIG. 12 is a flow chart for explaining the generation of the circuit pattern by the CAD when an insulative dummy pattern is used.

DESCRIPTION OF THE PREFERRED EMBODIMENTS

A description will be given of a first embodiment of a method of producing a semiconductor device according to the present invention, by referring to FIGS. 3A through 3C, 4A and 4B. This embodiment of the method produces a first embodiment of a semiconductor device according to the present invention.

Figure 3A:
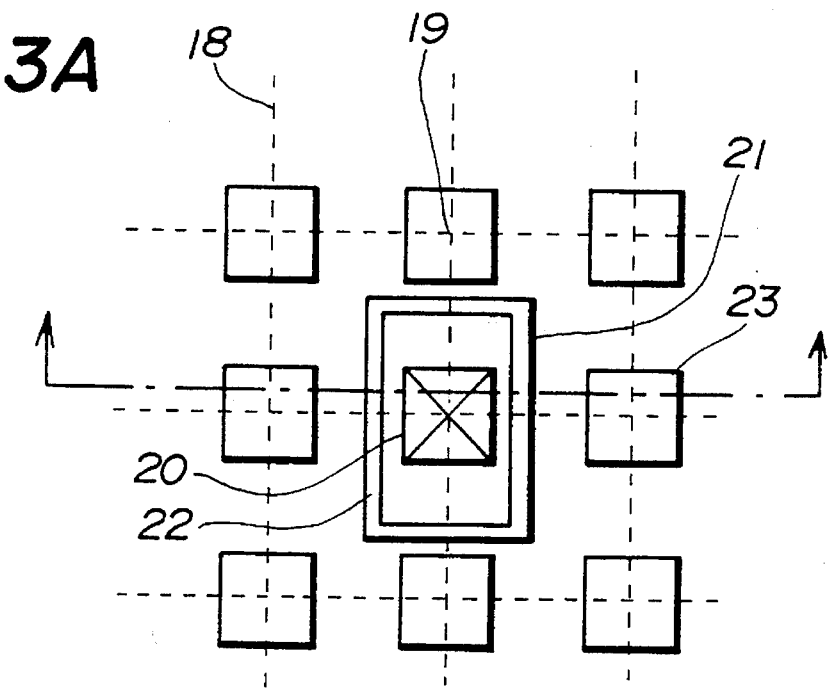
FIG. 3A is a plan view showing a circuit pattern which is generated from component information of a via hole pattern by a CAD for explaining a first embodiment of a method of producing a semiconductor device according to the present invention.
Figure 3B:
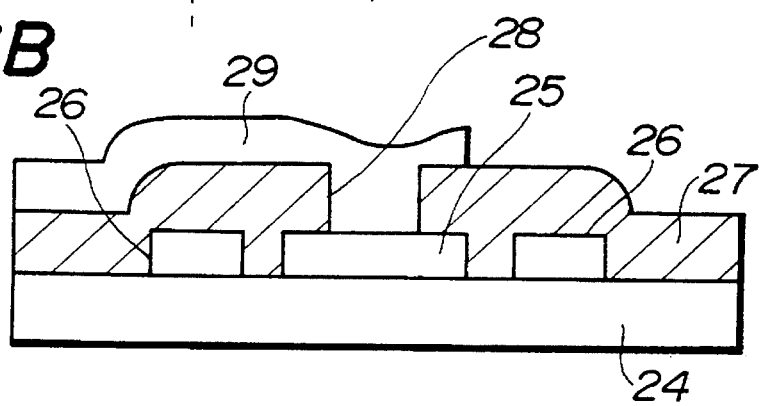
FIG. 3B is a cross sectional view showing a first embodiment of a semiconductor device which is produced based on the circuit pattern shown in FIG. 3A.
Figure 3C:
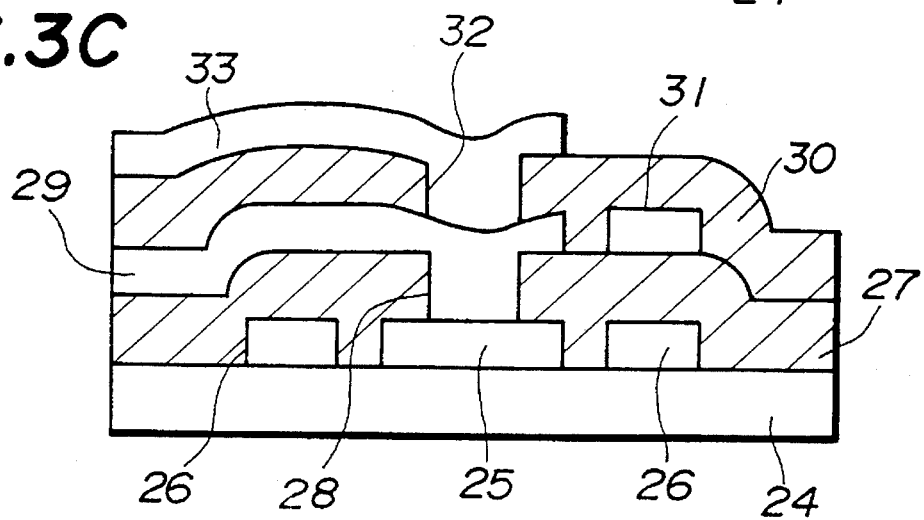
FIG. 3C is a cross sectional view showing a semiconductor device which is formed by providing further multi-level interconnection structure on the semiconductor device shown in FIG. 3B.

FIG. 3A shows a plan view of a circuit pattern which is generated from component information of a via hole pattern by a CAD. FIG. 3B shows a cross sectional view of the first embodiment of the semiconductor device which is produced based on the circuit pattern shown in FIG. 3A. FIG. 3C shows a semiconductor device which is formed by providing further multi-level interconnection structure on the semiconductor device shown in FIG. 3B.

In FIG. 3A, a lattice grid pattern 18 is used as a basis for arranging circuit patterns on a screen of a CRT device when processing data on a layout editer system. The position of each circuit pattern is determined by grids (intersections) 19 of the grid pattern 18. A via hole pattern 20 is used to connect an upper interconnection layer and a lower interconnection layer. Pad patterns 21 and 22 are respectively provided with respect to the upper and lower interconnection layers. In addition, 8 dummy patterns 23 are generated as component information of the via hole pattern 20 when generating the via hole pattern 20. The dummy patterns 23 are provided on the same layer (plane) as the pad pattern 22 of the lower interconnection, but the dummy patterns 23 are isolated from the pad patterns 21 and 22. The dummy pattern 23 has its center located on the grid 19 and has a size such that each side of the dummy pattern 23 is smaller than the pitch size of the grids 19 in order to prevent the dummy pad which is actually formed from making contact with an adjacent lower interconnection.

The pad patterns 21 and 22 are provided to guarantee positive connection of the upper and lower interconnections via the via hole. Hence, the pad patterns 21 and 22 respectively are larger than a region of the via hole pattern 20 by taking into account the alignment margin. When making the pattern arrangement by the CAD, the pad patterns 21 and 22 are generated as the component information of the via hole pattern 20 when the via hole pattern 20 is generated, similarly as in the case of the dummy patterns 23.

FIG. 3B shows the actual semiconductor device which is produced using a mask which has the circuit pattern shown in FIG. 3A. A lower interconnection 25 made of Al is formed on a substrate 24, and dummy pads 26 are also formed on the substrate 24 near the lower interconnection 25. An upper interconnection 29 made of Al connects to the lower interconnection 25 via a via hole 28 which is formed in an interlayer insulator 27. As is apparent from FIGS. 3A, 3B and 3C, the interlayer insulator 27 is a structural, i.e., non-fluid, type interlayer insulator. The dummy pads 26 are located in the periphery of the via hole 28.

Figure 4A:
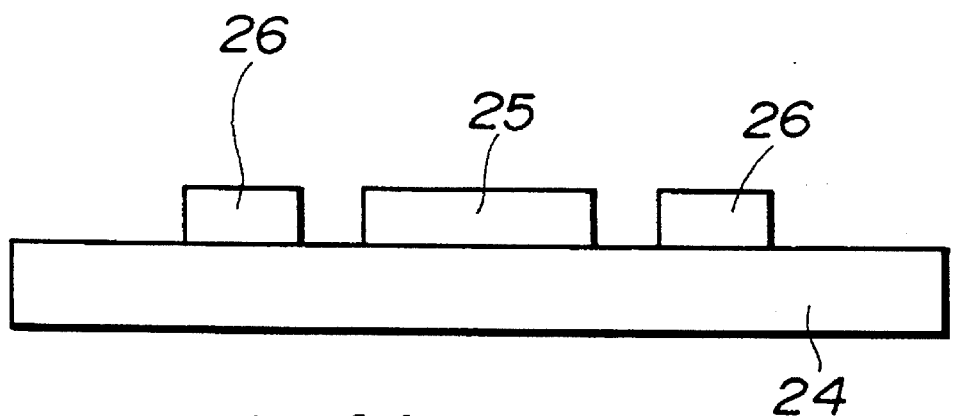
FIGS. 4A and 4B are cross sectional views for explaining the first embodiment of the method of producing the semiconductor device according to the present invention.
Figure 4B:
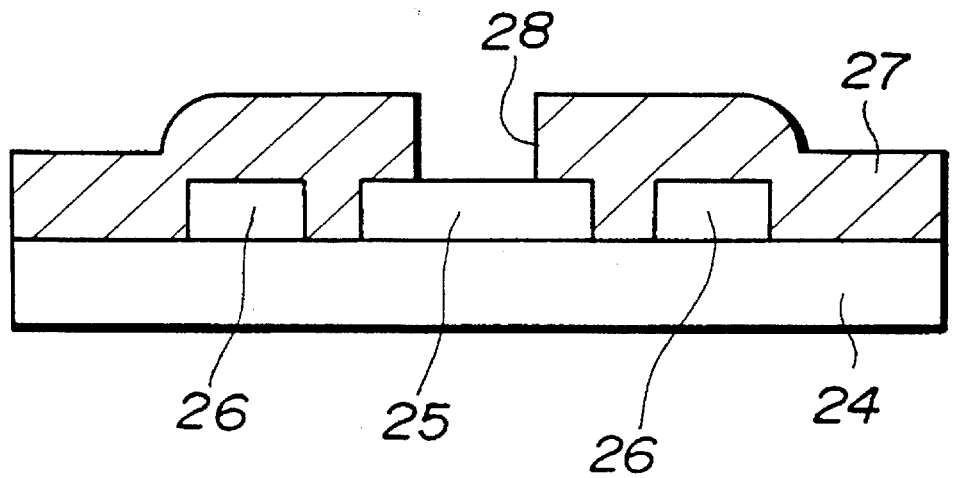

The semiconductor device shown in FIG. 3B is produced as follows. That is, a first Al layer is formed on the substrate 24, and the lower interconnection 25 and the dummy pads 26 are formed as shown in FIG. 4A by patterning the first Al layer. Then, the interlayer insulator 27 is formed, and the via hole 28 is formed in the interlayer insulator 27 by an etching as shown in FIG. 4B. Thereafter, a second Al layer is formed and patterned so as to form the upper interconnection 29 shown in FIG. 3B.

The upper interconnection 29 is formed using a mask pattern which is a combination of the pad pattern 21 which is used as the component pattern of the via hole 28 and an independent upper interconnection pattern (not shown). Similarly, the lower interconnection 25 is formed using a mask pattern which is a combination of the pad pattern 22 which is used as the component pattern of the via hole 28, the dummy pattern 26 and an independent lower interconnection pattern (not shown).

According to this embodiment of the method, 8 dummy patterns 23 are generated in the periphery of the via hole pattern 20 as shown in FIG. 3A as the component information of the via hole pattern 20. Hence, as shown in FIG. 3B, the dummy pads 26 are formed in the periphery of the via hole 28 and the height of the interlayer insulator 27 in the vicinity of the via hole 28 is kept approximately constant. As a result, it is easy to make the focal distance of the exposure apparatus constant when using a mask to expose and form the via hole 28 in the interlayer insulator 27, and via holes can be formed accurately and satisfactorily at any part of the substrate 24.

Figure 1A:
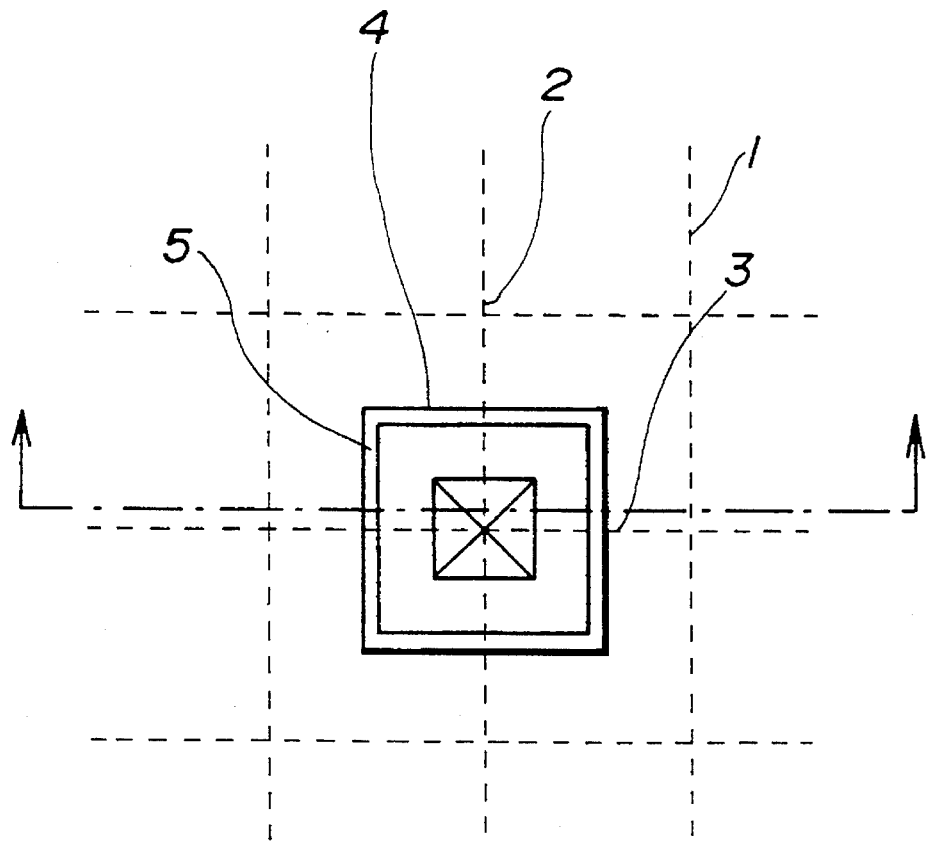
FIG. 1A is a plan view showing a circuit pattern which is generated from component information of a via hole pattern by a CAD.
Figure 1B:
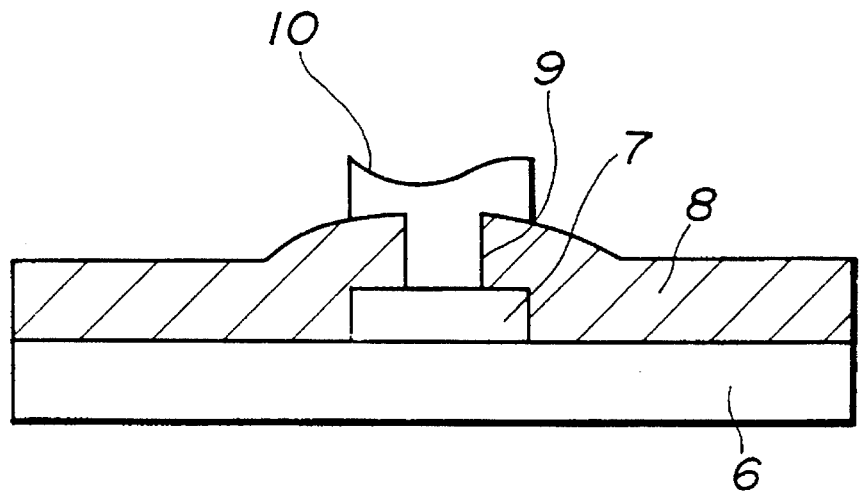
FIG. 1B is a cross sectional view showing a semiconductor device which is produced based on the circuit pattern shown in FIG. 1A.
Figure 2A:
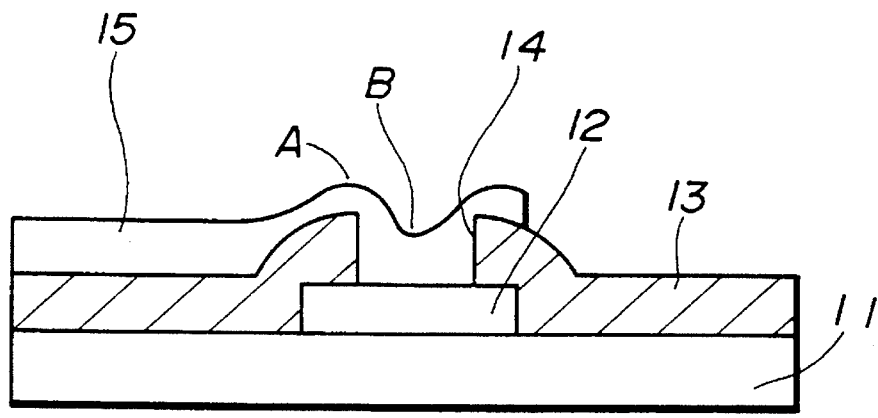
FIGS. 2A through 2C are cross sectional views respectively showing examples of conventional semiconductor devices having a via hole for explaining the problems thereof.

For this reason, the patterning of the upper interconnection 29 can also be carried out accurately and satisfactorily, and the generation of the thin part A and the dent B of the upper interconnection 15 of the conventional semiconductor device shown in FIG. 2A is positively prevented. It is also possible to prevent the generation of the sloping part of the upper interconnection 15 above the via hole 14 in the conventional semiconductor device shown in FIG. 2B.

In addition, when adding a further multi-level interconnection structure, a dummy pattern is generated when a via hole pattern is generated by the CAD, so as to form a dummy pad 31 adjacent to the upper interconnection 29 as shown in FIG. 3C. In this case, it is possible to make the height of an interlayer insulator 30 approximately constant in the vicinity of a via hole 32. Hence, it is possible to accurately and satisfactorily form the via hole 32 and an uppermost interconnection 33.

Figure 5:
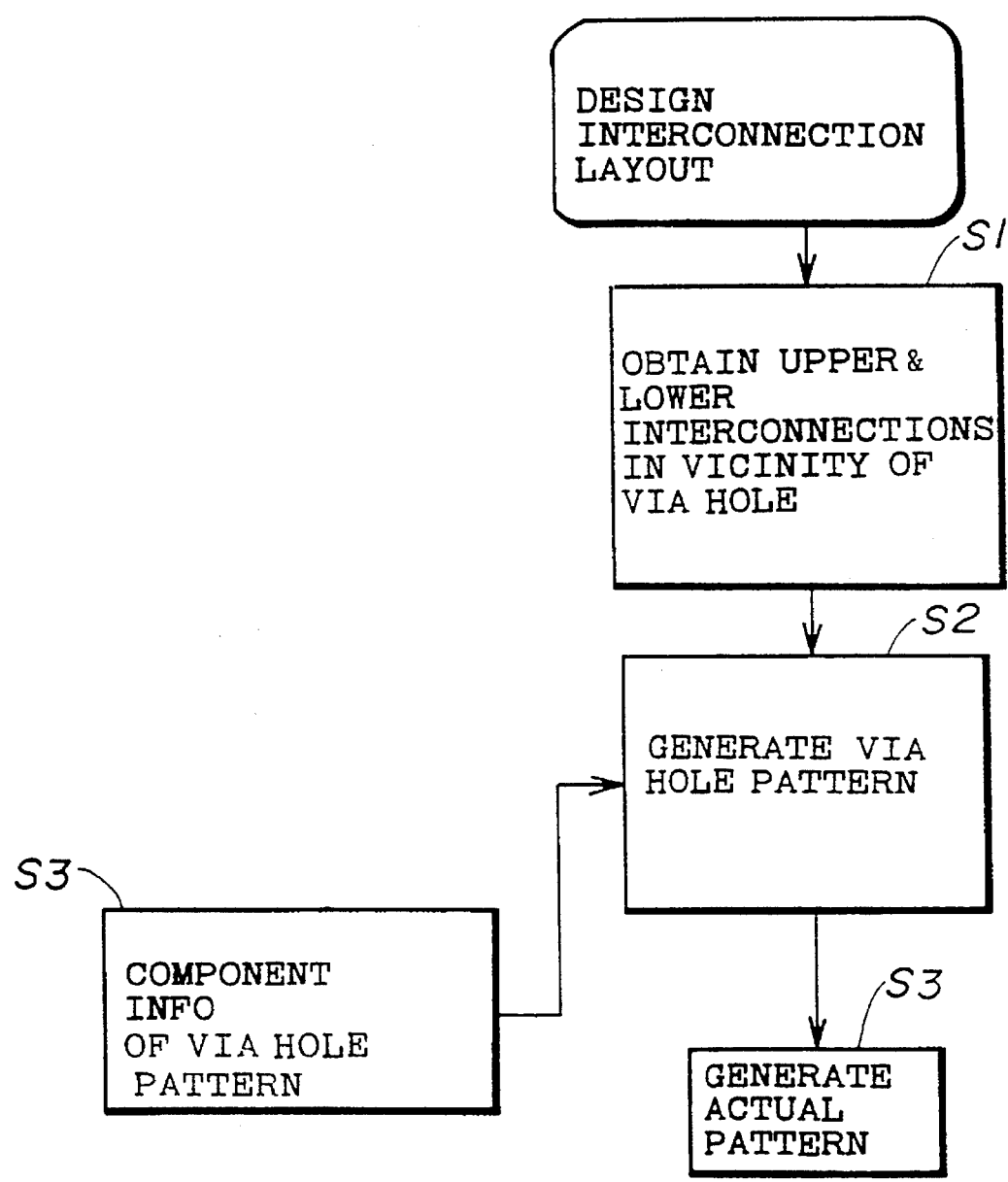
FIG. 5 is a flow chart for explaining the generation of the circuit pattern by the CAD.

FIG. 5 shows a flow chart for explaining the generation of the circuit pattern by the CAD. The via hole arrangement information includes the position on the grid pattern, the size of the via hole, the level of the interlayer insulator in which the via hole is to be formed and the like. The component information of the via hole pattern includes information related to the via hole patterns corresponding to each of the via holes, pad patterns of the upper and lower layers connecting to the via hole patterns, and dummy patterns formed in the periphery of the via holes.

A step S1 obtains the states of the upper and lower interconnections in the vicinity of the via hole which connects the interconnections. When the actual interconnection layout design is made, a step S2 selects a predetermined via hole pattern from the component information of the via hole pattern which is registered in the library based on the states obtained in the step S1. A step S3 generates the actual circuit pattern.

Accordingly, the unevenness or step formed at the layer surface in the vicinity of the via hole due to the surrounding interconnections and the like is effectively suppressed by the dummy pattern which is generated by the CAD, thereby making it possible to accurately align the mask and form a flat layer in the upper levels of the stacked structure. The via hole and the interconnections can be formed accurately and satisfactorily, so that a positive connection of the upper and lower interconnections via the via hole is realized. This means that a highly reliable semiconductor device having a multi-level interconnection structure can be produced.

Next, a description will be given of a second embodiment of the method of producing the semiconductor device according to the present invention, by referring to FIGS. 6A and 6B. This embodiment of the method produces a second embodiment of the semiconductor device according to the present invention.

Figure 6A:
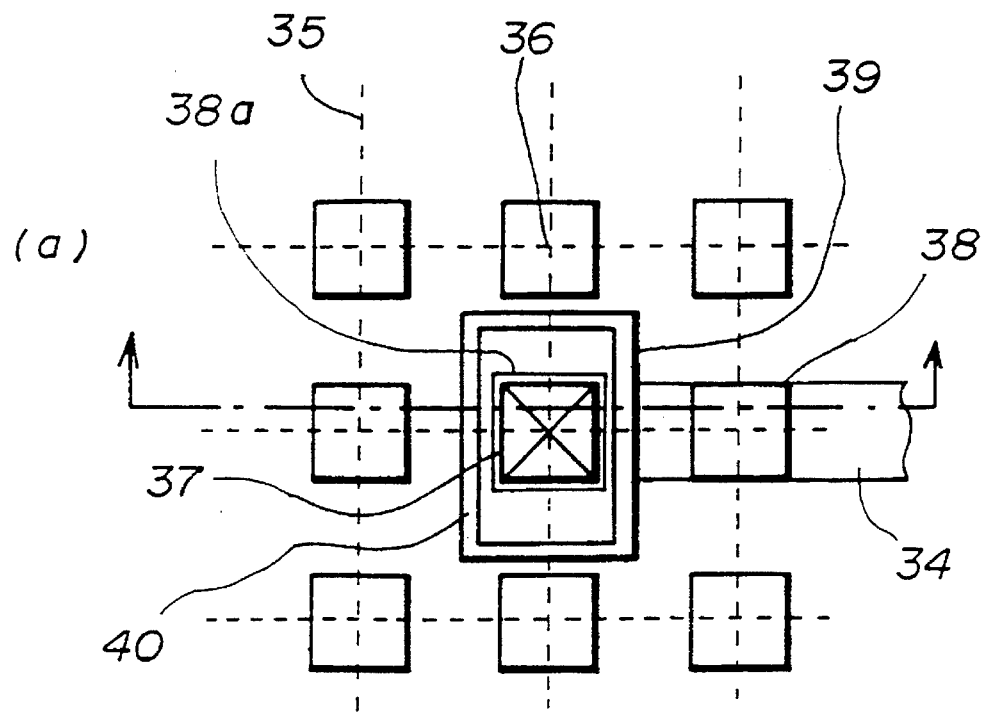
FIG. 6A is a plan view showing a circuit pattern which is generated from component information of a via hole pattern by a CAD for explaining a second embodiment of the method of producing the semiconductor device according to the present invention.

FIG. 6A shows a plan view of a circuit pattern which is generated from component information of a via hole pattern by the CAD. FIG. 6B shows a cross sectional view of the second embodiment of the semiconductor device which is produced based on the circuit pattern shown in FIG. 6A.

In FIG. 6A, a lattice grid pattern 35 is used as a basis for arranging circuit patterns on a screen of a CRT device when processing data on a layout editer system. The position of each circuit pattern is determined by grids (intersections) 36 of the grid pattern 18. An interconnection pattern 34 corresponds to a lowermost interconnection. A via hole pattern 37 is used to connect an upper interconnection layer and a lower interconnection layer. Pad patterns 39 and 40 are respectively provided with respect to the upper and lower interconnection layers. In addition, a dummy pattern 38 is generated as component information of the via hole pattern 37 when generating the via hole pattern 37. The dummy pattern 38 is isolated from the interconnection pattern 34 and the pad patterns 39 and 40. The dummy pattern 38 has its center located on the grid 36 and has a size such that each side of the dummy pattern 38 is smaller than the pitch size of the grids 36 in order to prevent the a dummy pad which is actually formed from making contact with an adjacent lowermost interconnection. Another dummy pattern 38a is formed on the same layer (plane) as the lowermost interconnection.

Figure 6B:
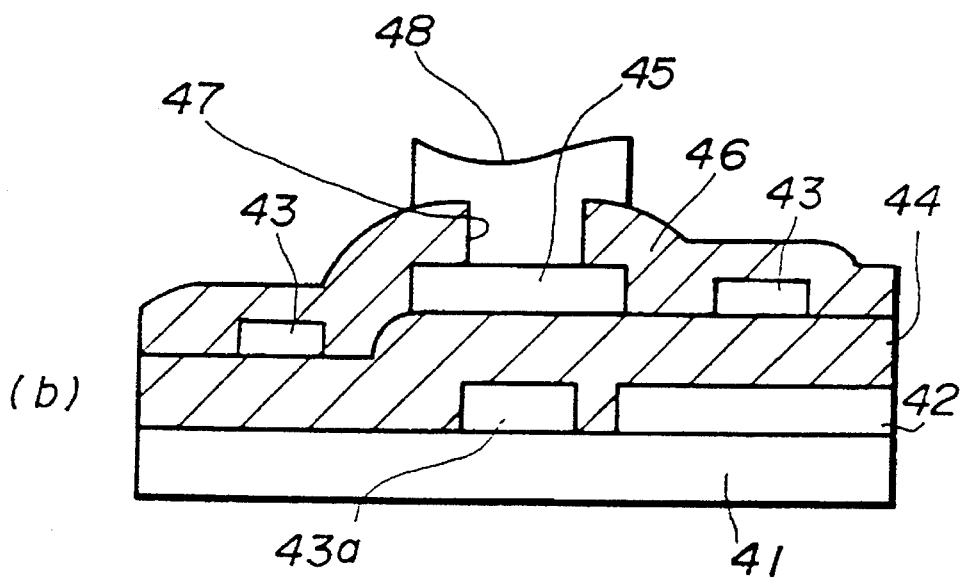
FIG. 6B is a cross sectional view showing a second embodiment of a semiconductor device which is produced based on the circuit pattern shown in FIG. 6A.

FIG. 6B shows the actual semiconductor device which is produced using a mask which has the circuit pattern shown in FIG. 6A. A lowermost interconnection 42 made of Al is formed on a substrate 41. This lowermost interconnection 42 corresponds to the interconnection pattern 34. A dummy pad 43 is formed on the interlayer insulator 44. This dummy pad 43 corresponds to the dummy pattern 38. Another dummy pad 43a is formed on the substrate 41 and corresponds to the dummy pattern 38a. An interlayer insulator 44 covers the lowermost interconnection 42 and the dummy pad 43 on the substrate 41, and a lower interconnection 45 made of Al is formed on the interlayer insulator 44. An upper interconnection 48 made of Al connects to the lower interconnection 45 via a via hole 47 which is formed in an interlayer insulator 46.

In this embodiment, when the lower interconnection 45 is formed adjacent to the via hole 47, the dummy pad 43 is formed on the same plane (that is, layer) as the lower interconnection 45. Hence, the dummy pattern 38 is generated when generating the via hole pattern 37. As a result, it is possible to planarize the interlayer insulator 44 in the vicinity of the via hole 47. Furthermore, the dummy pad 43a is formed under the via hole 47 on the same plane (layer) as the lowermost interconnection 42, and it is possible to further planarize the interlayer insulator 44 in the vicinity of the via hole 47. Thus, the via hole 47 and the upper interconnection 48 can be formed accurately and satisfactorily. The dummy pad 43a can be obtained with ease by registering in advance the dummy pattern 38a which corresponds to this dummy pad 43a into the component of the via hole pattern.

Figure 7:
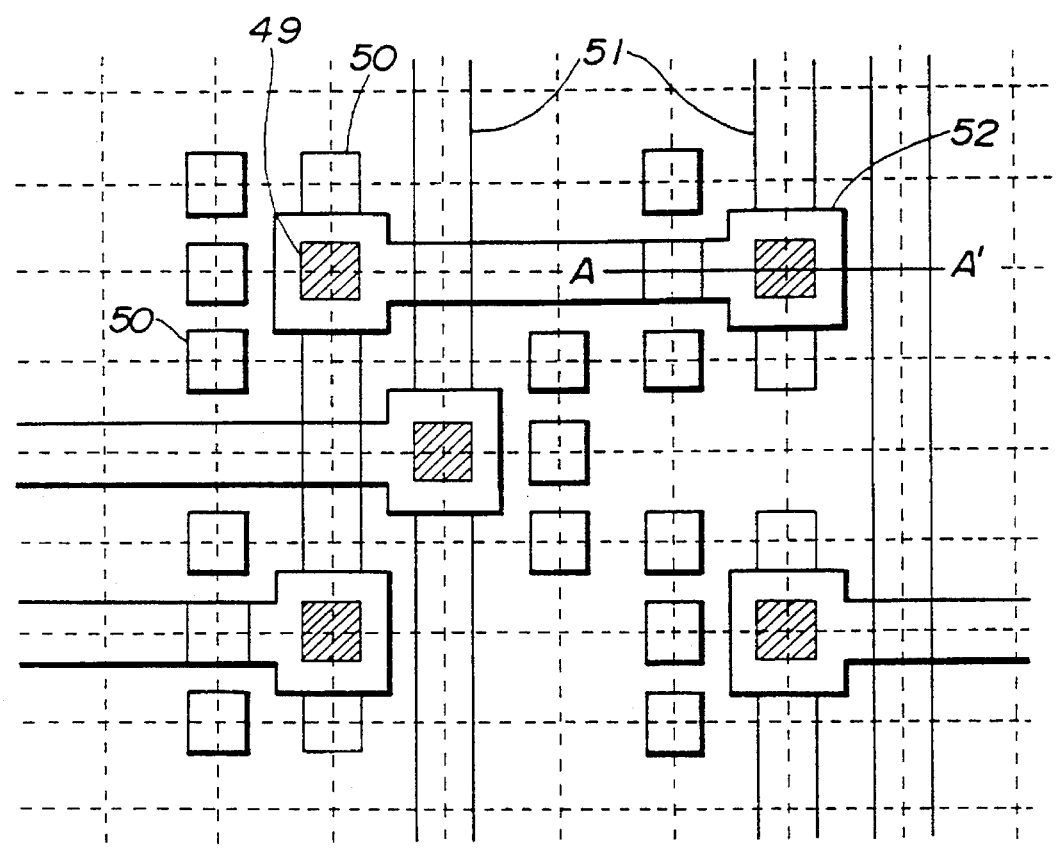
FIG. 7 is a plan view showing an integrated circuit pattern for upper and lower layers and a via hole for explaining a third embodiment of the semiconductor device according to the present invention.
Figure 7:
Figure 7:

Next, a description will be given of a third embodiment of the semiconductor device according to the present invention, by referring to FIGS. 7 and 8. FIG. 7 shows a plan view of an integrated circuit pattern for the upper and lower layers and the via hole, while FIG. 8 shows a plan view of the integrated circuit pattern for only the lower layer.

In FIG. 7, a dummy pattern 50 is generated in the periphery of a via hole pattern 49 by the CAD based on the component information Of the via hole pattern 49. This dummy pattern 50 is formed on the same plane (that is, layer) as the lower interconnection, but the two are isolated from each other. An upper interconnection pattern 52 is connected to a lower interconnection pattern 51 via the via hole pattern 49. Pad patterns of the upper and lower interconnections are respectively generated above and below the via hole pattern 49 by the CAD based on the component information of the via hole pattern 49, but the pad patterns are respectively a part of the upper and lower interconnection patterns 52 and 51 and not shown in FIG. 7.

Figure 8:
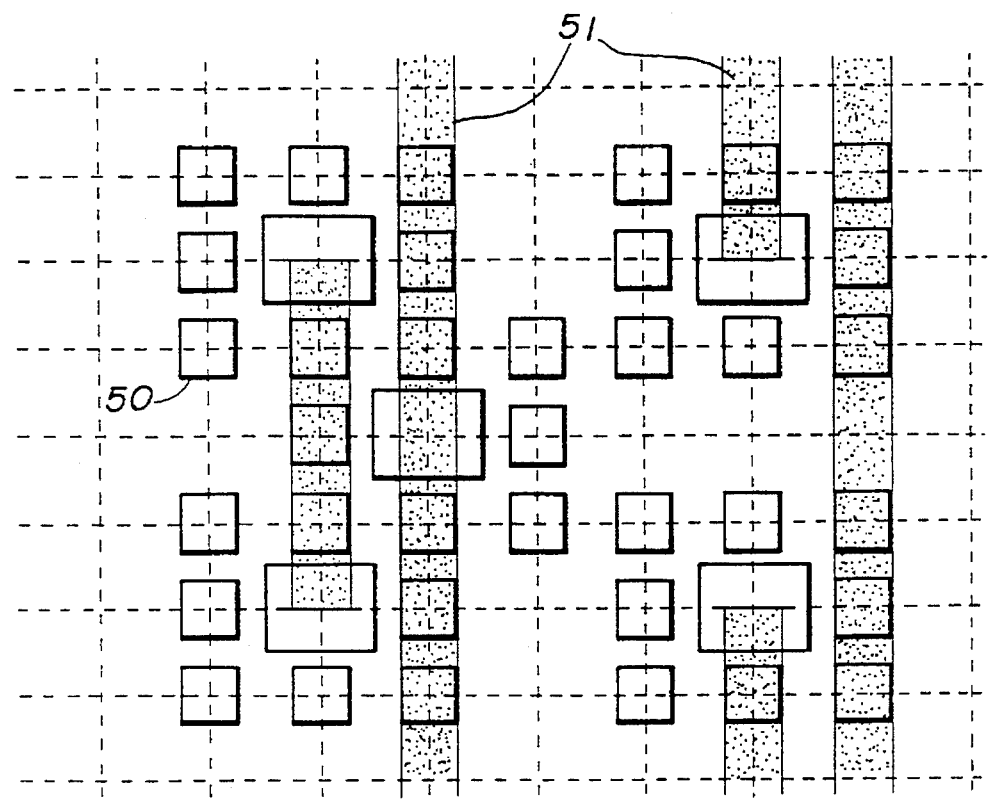
FIG. 8 is a plan view showing the integrated circuit pattern for only the lower layer for explaining a third embodiment of the semiconductor device according to the present invention.
Figure 8:
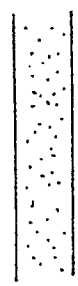
Figure 8:
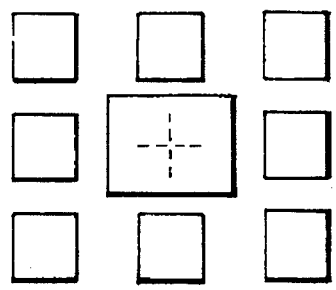

In FIG. 8, the lower interconnection pattern 51 is indicated by a shaded area.

By appropriately generating the dummy pattern in the periphery of the via hole pattern by the CAD based on the component information of the via hole pattern and the arrangement information of the via hole, it becomes possible to adjust the height of the interlayer insulator in the periphery of the via hole. In other words, it is possible to planarize the interlayer insulator in the vicinity of where the via hole is to be formed, so that the via hole can be formed accurately and satisfactorily. Hence, the upper and lower interconnection can be positively connected via the via hole, and it is possible to produce a semiconductor device having a highly reliable multi-level interconnection structure. Moreover, the dummy pattern in the present invention is generated only in the periphery of the via hole, and the increase of the line capacitance caused thereby is only slight.

In this embodiment, the cross section along a line A—A' in FIG. 7 becomes as shown in FIG. 3B.

Figure 2B:
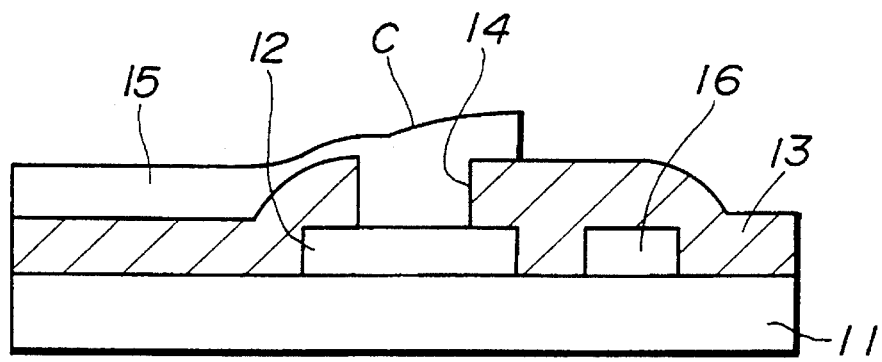
Figure 2C:
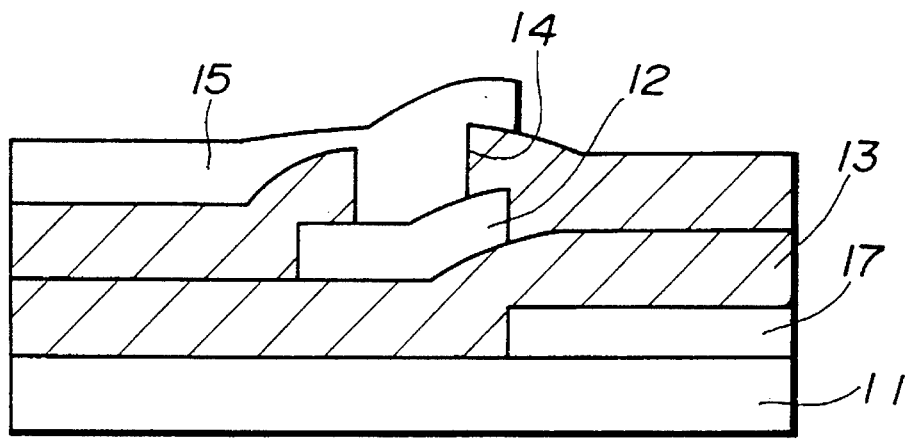
Figure 9:
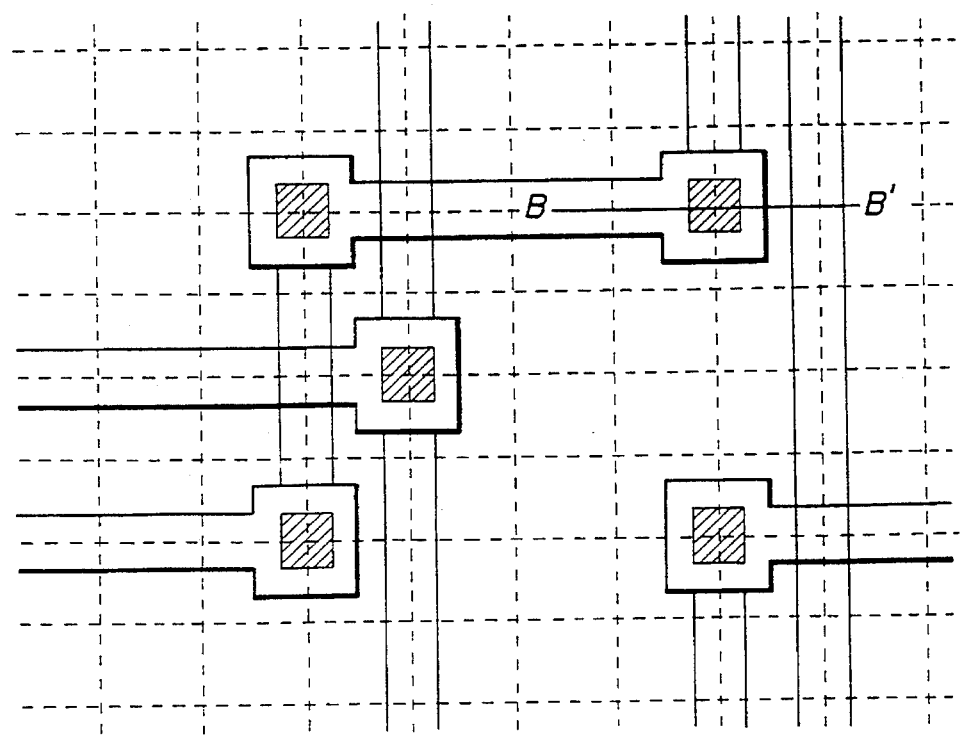
FIG. 9 is a plan view showing an integrated circuit pattern for explaining a conventional method of producing the semiconductor device having the same interconnection patterns as in FIG. 7.
Figure 9:

But when the same interconnection pattern shown in FIG. 7 is formed using the conventional method which does not use a dummy pattern as shown in FIG. 9, the cross section along a line B—B' in FIG. 9 becomes as shown in FIG. 2B, and the problems described above are introduced.

In each of the embodiments described above, the dummy pattern is made of the same conductor which forms the adjacent interconnection which is formed on the same plane (that is, layer) as the dummy pattern. Hence, there is an advantage in that the dummy pattern and the adjacent interconnection can be formed simultaneously in one process. However, the thickness of the dummy pattern becomes the same as the thickness of the adjacent interconnection pattern. In addition, when a large number of conductive dummy patterns are used, the stray capacitance of the interconnection no longer becomes negligible.

Next, descriptions will be given of embodiments in which the thickness of the dummy pattern and the thickness of the interconnection can be controlled independently and the increase of the stray capacitance of the interconnection is prevented.

A third embodiment of the method of producing the semiconductor device according to the present invention will be described with reference to FIGS. 10A through 10D. In FIGS. 10A through 10D, those parts which are the same as those corresponding parts in FIG. 3B are designated by the same reference numerals, and a description thereof will be omitted.

Figure 10A:
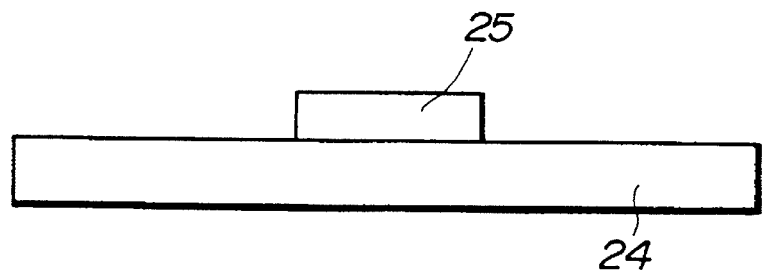
FIGS. 10A through 10D respectively are cross sectional views for explaining a third embodiment of the method of producing the semiconductor device according to the present invention.
Figure 10B:
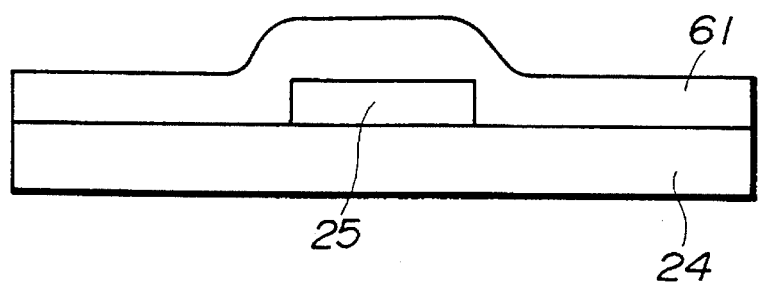
Figure 10C:
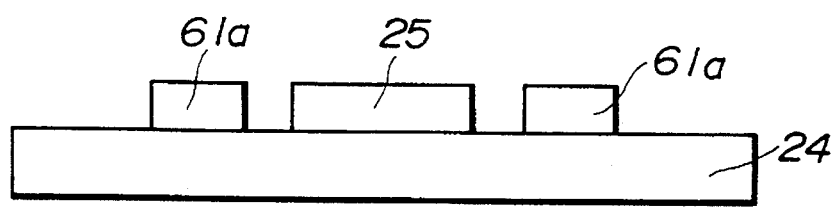
Figure 10D:
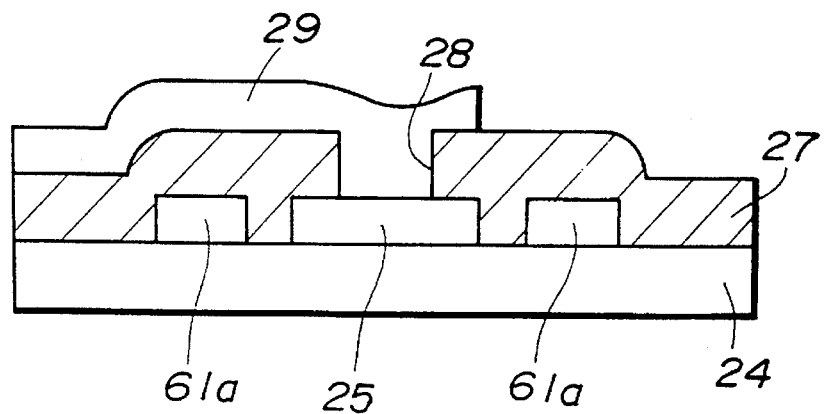

First, the first Al layer is formed on the substrate 24, and the lower interconnection 25 is formed as shown in FIG. 10A by patterning this first Al layer. Then, an insulator layer 61 is formed as shown in FIG. 10B, and dummy pads 61a shown in FIG. 10C are formed by patterning the insulator layer 61. Thereafter, the processes similar to those of the first embodiment of the method are carried out to successively form the interlayer insulator 27, the via hole 28 and the upper interconnection 29. As a result, a fourth embodiment of the semiconductor device according to the present invention is formed as shown in FIG. 10D. When adding a further multi-level interconnection structure, it is of course possible to form the multi-level interconnection structure on top of the structure shown in FIG. 10D, as shown in FIG. 3C, for example.

According to this embodiment, it is possible to prevent the stray capacitance of the lower interconnection 25 from increasing because the dummy pads 61a are made of an insulator material. In addition, the thickness of the dummy pad 61a may be controlled independently of the thickness of the lower interconnection 25. In this embodiment, the lower interconnection 25 and the dummy pattern 61a are formed using different masks.

Figure 11:
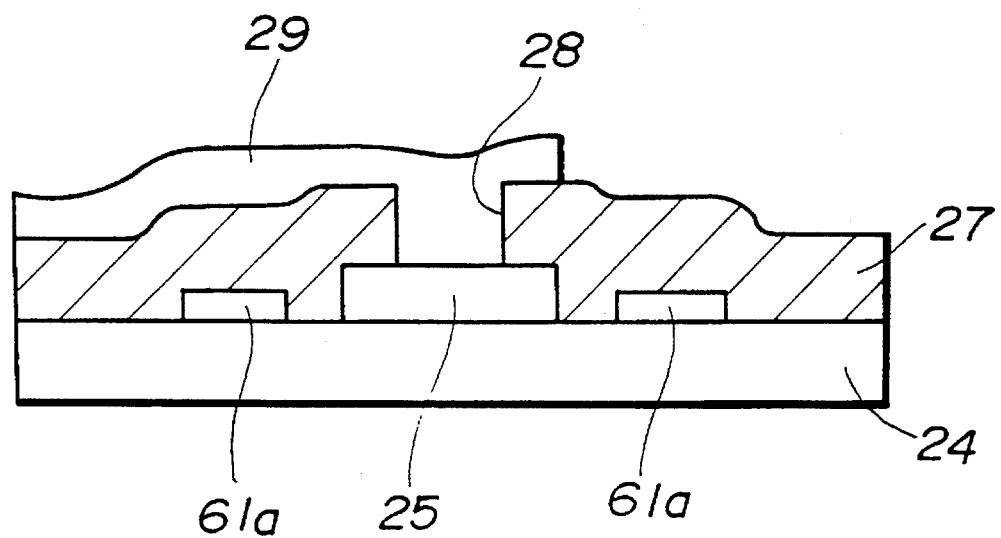
FIG. 11 is a cross sectional view showing a fifth embodiment of the semiconductor device according to the present invention.

FIG. 11 shows a fifth embodiment of the semiconductor device according to the present invention. In FIG. 11, those parts which are the same as those corresponding parts in FIG. 10D are designated by the same reference numerals, and a description thereof will be omitted.

In this embodiment, the dummy pad 61a is thinner than the the lower interconnection 25. By using the dummy pad 61a which has a thickness different from that of the lower interconnection 25, it is possible to further reduce the unevenness or step in the upper layers by changing the thickness of the interlayer insulator in steps for each grid over a plurality of grids in the grid pattern.

Of course, the dummy pattern made of the insulator material may also be used in the structure shown in FIG. 6B, for example.

When the insulative dummy pattern is used, it is possible to judge by the layout program whether or not the arrangement of the via hole and the dummy pattern is possible by only looking at the grids where the via hole is to be provided. Accordingly, it is possible to freely provide the dummy pattern on the grids inside a cell in which a plurality of regions where the provision of the interconnection is prohibited exist at scattered locations, and the semiconductor device may be designed with a large degree of freedom.

FIG. 12 shows a flow chart for explaining the generation of the circuit pattern by the CAD when the insulative dummy pattern is used. A step S11 determines the arrangement and the interconnections of each constituent elements of the semiconductor device based on a logic net list, a chip shape library, a cell shape library, a wiring rule and the like. A step S12 outputs physical information related to the determined result of the step S11.

On the other hand, at least one dummy pattern and a via hole are registered in a real pattern library as the component information of a via hole pattern. A step S14 generates a mask pattern based on the physical information and the real pattern library, and a step S15 starts the production process related to the interconnection system.

After the arrangement and the interconnection of each constituent element of the semiconductor device are determined in the step S11, no special process is required. However, in a case where insulative dummy patterns are prearranged on the entire interconnection region, for example, it is necessary to compare the dummy patterns and the interconnection result and so that the dummy patterns do not overlap the regions where the provision of the dummy pattern is prohibited. A step S13 indicated by a broken line corresponds to a computer process which makes a selective arrangement of such dummy patterns.

Further, the present invention is not limited to these embodiments, but various variations and modifications may be made without departing from the scope of the present invention.

What is claimed is:

1. A method of producing a semiconductor device comprising the steps of:

(a) forming a first interconnection layer and at least one dummy pad on a first layer, the dummy pad being located in the vicinity of and closely adjacent but spaced from the periphery of the first interconnection layer and being of substantially the same thickness as the first interconnection layer;

(b) forming a second layer, of a non-fluid type interlayer insulator material, on the first layer and so as to cover the first interconnection layer and the dummy pad, the portion of the second layer covering the first interconnection layer and extending at least beyond the periphery thereof and toward the dummy pad being of substantially uniform thickness and having an upper surface which is substantially planar and of substantially uniform height relative to the first layer;

(c) forming a via hole in the portion of the second layer having a substantially planar upper surface by use of a mask, the via hole extending transversely from the upper surface and through the second layer thereby to expose a corresponding portion of the surface of the first interconnection layer, said dummy pad being formed substantially only in the vicinity of but displaced from the via hole;

(d) forming a second interconnection layer on the second layer and extending through the via hole into electrical contact with the first interconnection layer, said dummy pad being electrically isolated from the first and second interconnection layers;

(e) generating a dummy pad pattern by a computer aided design (CAD) based on via hole arrangement information and component information of via hole pattern for use in at least said steps (a) and (c), said via hole arrangement information at least including information related to position of the via hole, said component information of via hole pattern including at least a via hole pattern indicative of the shape of the via hole and position of dummy pads with respect to the via hole; and (f) forming the mask based on the via hole pattern for use in said step (c).

2. A method of producing a semiconductor device comprising the steps of:

(a) forming a first interconnection layer and at least one dummy pad on a first layer using a mask, the dummy pad being located in the vicinity of and closely adjacent but spaced from the periphery of the first interconnection layer and being of substantially the same thickness as the first interconnection layer;

(b) forming a second layer, of a non-fluid type interlayer insulator material, on the first layer and so as to cover the first interconnection layer and the dummy pad, the portion of the second layer covering the first interconnection layer and extending at least beyond the periphery thereof and toward the dummy pad being of substantially uniform thickness and having an upper surface which is substantially planar and of substantially uniform height relative to the first layer;

(c) forming a via hole in the portion of the second layer having a substantially planar upper surface, the via hole extending transversely from the upper surface and through the second layer thereby to expose a corresponding portion of the surface of the first interconnection layer, said dummy pad being formed substantially only in the vicinity of but displaced from the via hole;

(d) forming a second interconnection layer on the second layer and extending through the via hole into electrical contact with the first interconnection layer, said dummy pad being electrically isolated from the first and second interconnection layers;

(e) registering in a library component information of a via hole pattern, the component information including information related to shape of the via hole and including information related to the position of dummy pads with respect to the via hole; and (f) reading the component information from the library and forming the mask based on the component information, said mask formed in step (f) being used in step (a).

3. The method of producing the semiconductor device as claimed in claim 1, wherein said step (a) forms the first interconnection layer and the dummy pad simultaneously from the same material using the same mask.

4. The method of producing the semiconductor device as claimed in claim 2, wherein said step (a) forms the first interconnection layer and the dummy pad independently of different materials using mutually different masks.

5. The method of producing the semiconductor device as claimed in claim 4, wherein said step (a) forms the dummy pad from an insulator material.

6. The method of producing the semiconductor device as claimed in claim 2, wherein the mask formed in step (f) has a dummy pad patterned with its center located on a grid of a grid pattern and has sides which are respectively shorter than a pitch of grids of the grid pattern.

7. The method of producing the semiconductor device as claimed in claim 1, wherein positions of the via hole and the dummy pad pattern are determined by grids of a lattice grid pattern.

8. The method of producing the semiconductor device as claimed in claim 2, wherein positions of the via hole and the dummy pad pattern are determined by grids of a lattice grid pattern.

* * * * *

UNITED STATES PATENT AND TRADEMARK OFFICE
CERTIFICATE OF CORRECTION

PATENT NO. : 5,556,805
DATED : September 17, 1996
INVENTOR(S) : Tetsu TANIZAWA et al.

It is certified that error appears in the above-indentified patent and that said Letters Patent is hereby corrected as shown below:

<u>Col. 6</u>, line 67, change "Of" to --of--.

<u>Col. 10</u>, line 32, change "1" to --2--.

Signed and Sealed this

Eighteenth Day of February, 1997

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,556,805
DATED : September 17, 1996
INVENTOR(S) : Tetsu TANIZAWA et al.

It is certified that error appears in the above-indentified patent and that said Letters Patent is hereby corrected as shown below:

Cover Page, Item [75], change "Takuda" to --Tokuda--.

Signed and Sealed this

Eighth Day of September, 1998

Attest:

BRUCE LEHMAN

Attesting Officer

Commissioner of Patents and Trademarks